(12) United States Patent
Chen et al.

(10) Patent No.: US 11,497,310 B2
(45) Date of Patent: Nov. 15, 2022

(54) SLIDE RAIL ASSEMBLY (71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Tzu-Cheng Weng, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 297 days.

(21) Appl. No.: 17/063,684

(22) Filed: Oct. 5, 2020

(65) Prior Publication Data
US 2021/0353061 A1    Nov. 18, 2021

(30) Foreign Application Priority Data
May 18, 2020   (TW) .................................. 109116610

(51) Int. Cl.
*F16C 29/04* (2006.01)
*A47B 88/00* (2017.01)
*A47B 88/493* (2017.01)
*A47B 88/423* (2017.01)

(52) U.S. Cl.
CPC .......... *A47B 88/493* (2017.01); *A47B 88/423* (2017.01); *F16C 29/046* (2013.01); *A47B 2210/0032* (2013.01)

(58) Field of Classification Search
CPC ................ A47B 88/423; A47B 88/493; A47B 2210/0032; F16C 29/046; F16C 29/048
See application file for complete search history.

(56) References Cited

U.S. PATENT DOCUMENTS

| 8,485,616 | B2 | 7/2013 | Chen | |
| 9,788,655 | B2 | 10/2017 | Chen | |
| 10,555,607 | B2 | 2/2020 | Chen | |
| 2002/0089273 | A1* | 7/2002 | Weng | A47B 88/487 312/334.1 |

(Continued)

FOREIGN PATENT DOCUMENTS

| EP | 2777431 | 9/2014 |
| EP | 3 253 188 A1 | 12/2017 |

(Continued)

*Primary Examiner* — Phillip A Johnson
(74) *Attorney, Agent, or Firm* — Winston Hsu (57) ABSTRACT

A slide rail assembly includes a first rail, a second rail and first function member. The first rail has a passage. The second rail is movably mounted in the passage of the first rail. The least one function member is arranged on the first rail and adjacent to an end portion of the first rail. The least one function member includes a first function portion located in the passage and a second function portion exceeding the end portion of the first rail. When the second rail is moved along a direction from a predetermined position and a rail section of the second rail exceeds the end portion and is located at outside of the channel of the first rail, the second function portion of the least one function member is configured to support at least one part of the rail section of the second rail.

18 Claims, 10 Drawing Sheets

(56) References Cited

U.S. PATENT DOCUMENTS

| | | | |
|---|---|---|---|
| 2007/0040485 A1* | 2/2007 | Tseng | A47B 88/493 312/334.44 |
| 2009/0096340 A1* | 4/2009 | Chen | A47B 88/493 312/334.46 |
| 2014/0265786 A1 | 9/2014 | Chen | |
| 2016/0278232 A1 | 9/2016 | Chen | |
| 2016/0286683 A1 | 9/2016 | Chen | |

FOREIGN PATENT DOCUMENTS

| | | |
|---|---|---|
| EP | 3 620 080 A1 | 3/2020 |
| JP | 3173758 U | 2/2012 |
| JP | 3196235 U | 2/2015 |
| JP | 2017-86860 A | 5/2017 |
| JP | 2019-155075 A | 9/2019 |

\* cited by examiner

SLIDE RAIL ASSEMBLY

BACKGROUND OF THE INVENTION

1. Field of the Invention

The present invention relates to a slide rail assembly, and more particularly, to a slide rail assembly with improved slide rail support structure configuration.

2. Description of the Prior Art

Figure 1:
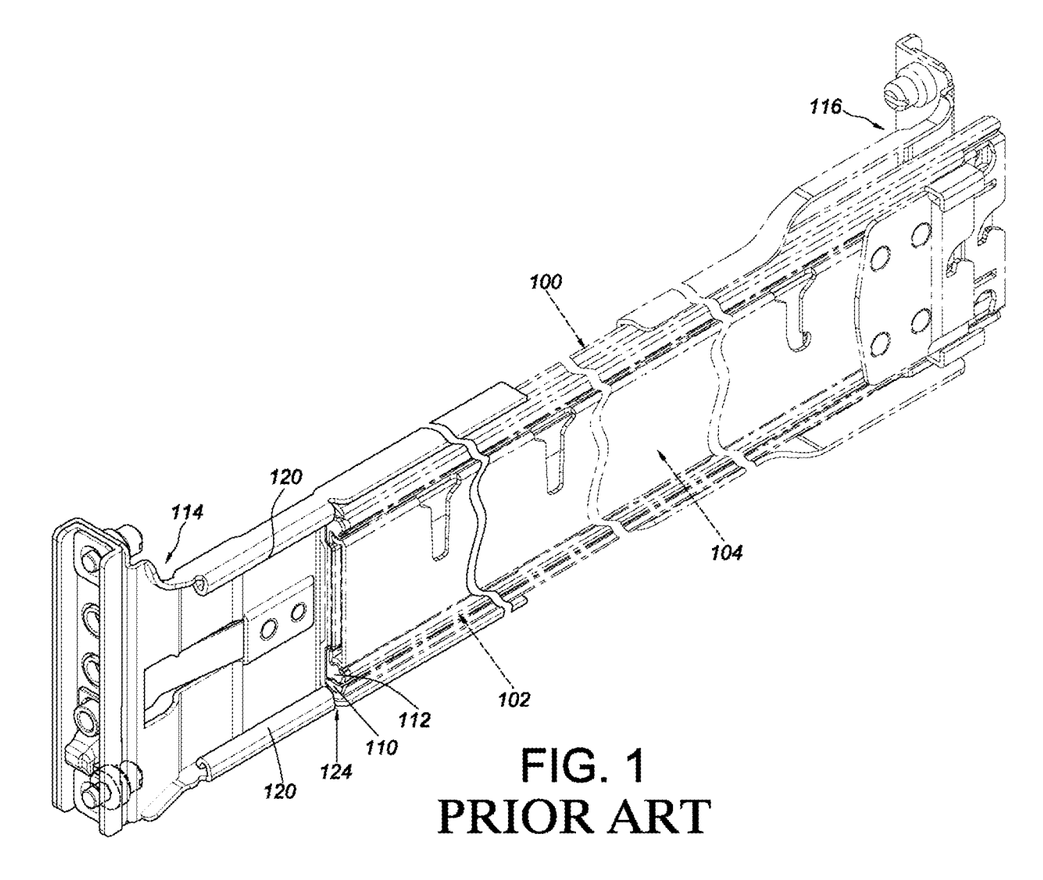
FIG. 1 is a diagram illustrating a slide rail assembly with a slide rail support structure being in a retracted state according to prior art.
Figure 2:
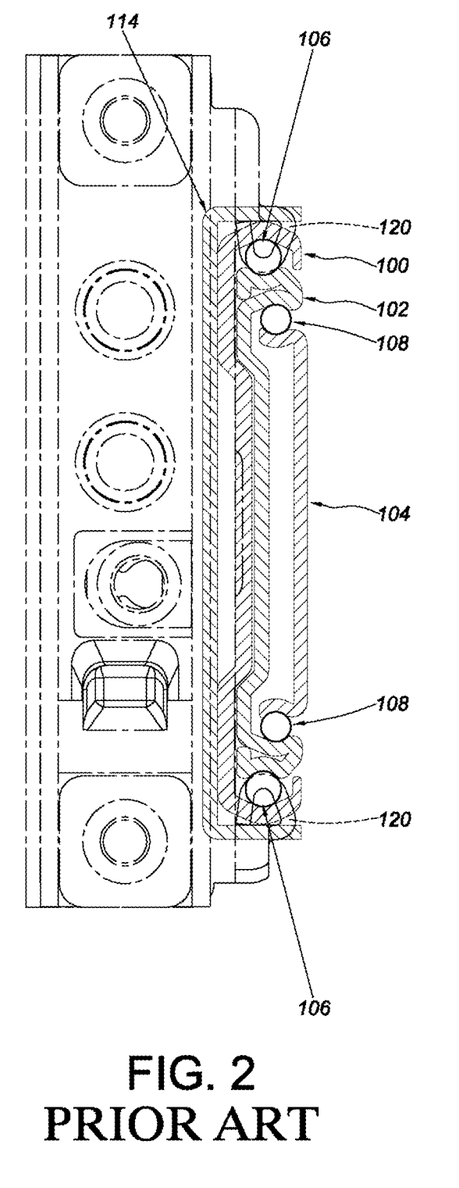
FIG. 2 is a cross-section view illustrating the slide rail assembly according to prior art.
Figure 3:
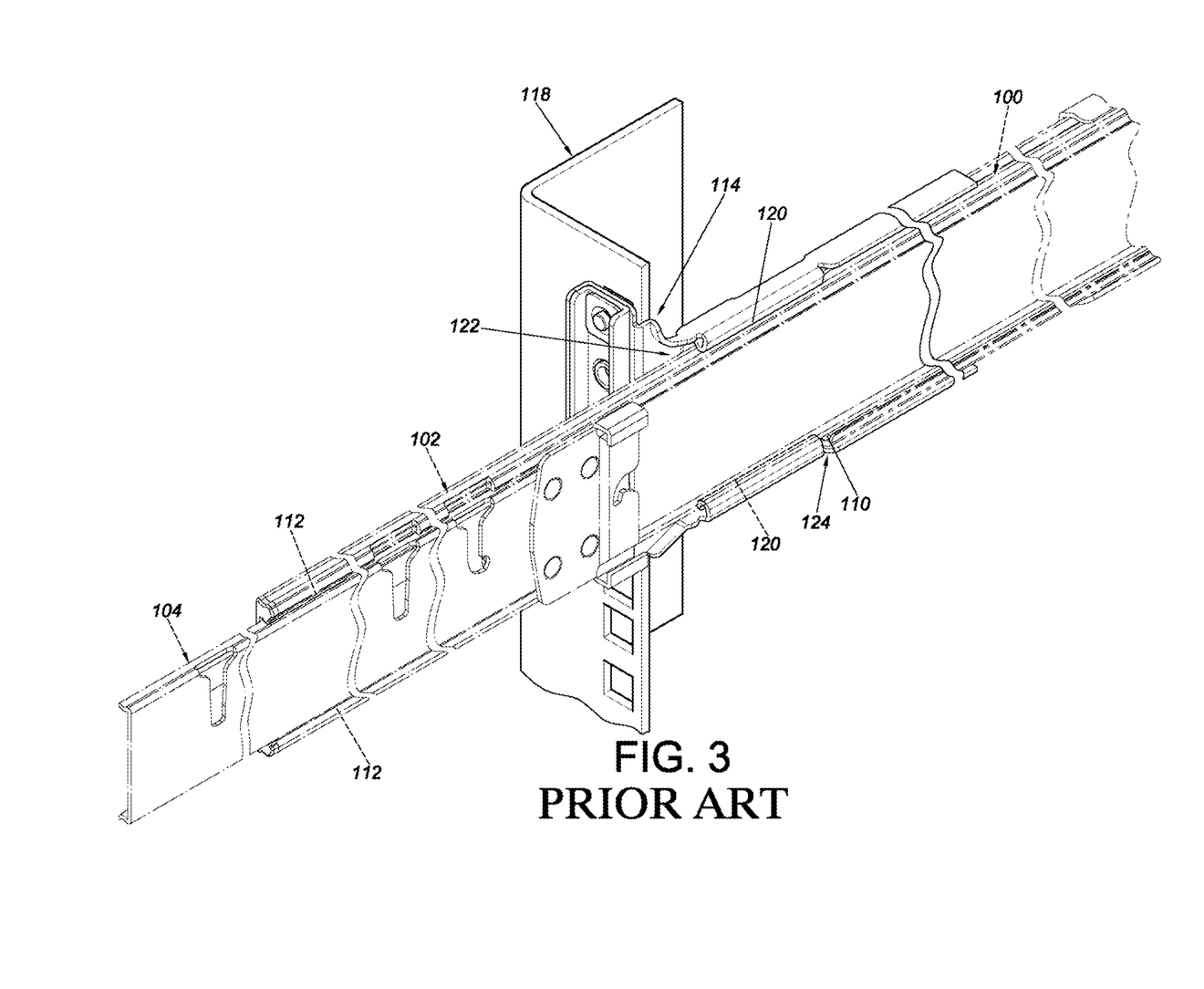
FIG. 3 is a diagram illustrating the slide rail assembly with the slide rail support structure being mounted on a rack and in an extended state according to prior art.

As shown in FIG. 1 to FIG. 3, a slide rail assembly equipped with a slide rail support structure is illustrated. The slide rail assembly includes a first rail 100, a second rail 102, a third rail 104, a first rolling ball device 106, a second rolling ball device 108, a first blocking base 110, a second blocking base 112, a first bracket 114 and a second bracket 116. Wherein, the first rolling ball device 106 is arranged between the first rail 100 and the second rail 102. The second rolling ball device 108 is arranged between the second rail 102 and the third rail 104. The first blocking base 110 is fixedly arranged adjacent to a front end of the first rail 100 and configured to block the first rolling ball device 106 from sliding out from the first rail 100 and further support the second rail 102. Similarly, the second blocking base 112 is fixedly arranged adjacent to a front end of the second rail 102 and configured to block the second rolling ball device 108 from sliding out from the second rail 102 and further support the third rail 104. The first bracket 114 and the second bracket 116 are respectively arranged on two ends of the first rail 100, in order to mount the slide rail assembly on two posts of a rack. For example, as shown in FIG. 3, the first bracket 114 is mounted on a front post 118 of a rack. Two support members 120 are respectively arranged on an upper side and a lower side of the first bracket 114 (as shown in FIG. 1 and FIG. 3), and configured to contact the second rail 102 when the second rail 102 is moved in a passage 122 defined by the upper side and the lower side of the first bracket 114. The two support members 120 are able to support the second rail 102, to further improve the supporting ability between the first bracket 114 and the second rail 102.

The aforementioned FIG. 1 to FIG. 3 is applicant's previous design of the present application (Publication No. EP 2,777,431 B1). However, due to the different load capacity of slide rails required by chassis of different standard, many different rail cross-section types have been developed to meet different chassis mounting requirements. The two support members 120 of a prior art not only needs to be additionally configured, but also needs to ensure the contacting structure which the two support members 120 supporting the slide rail (e.g. the second rail 102) in an extended position, so as to achieve effective support. In addition, due to the two support members 120 are arranged on the first bracket 114, a gap 124 is formed between the two support members 120 and the first blocking base 110. Therefore, the structural strength still can be improved. On the other hand, due to the two support members 120 are arranged on the first bracket 114, in order to correspond to the slide rails according to the specifications of different chassis (such as 1U chassis or 2U chassis), the bracket needs to be prepared with components of 1U, 2U or other standards. Extra materials cause extra costs and increase the burden of inventory management.

Therefore, in order to optimize the design of the prior art, the present invention is provided.

SUMMARY OF THE INVENTION

An object of the present invention relates to a slide rail assembly with improved slide rail support structure configuration.

According to an aspect of the present invention, a slide rail assembly includes a first rail, a second rail, a sliding auxiliary device and a first function member. The first rail includes a first wall, a second wall and a first longitudinal wall connected between the first wall and the second wall. A passage is defined by the first wall, the second wall and the first longitudinal wall. The second rail is movably mounted in the passage of the first rail. The sliding auxiliary device is arranged in the passage of the first rail. The sliding auxiliary device includes a plurality of rolling members configured to support between the first rail and the second rail. The first function member is arranged on the first rail and adjacent to an end portion of the first rail. Wherein, the first function member includes a first function portion and a second function portion. The first function portion is located in the passage of the first rail. The second function portion exceeds the end portion of the first rail and located at outside of the passage of the first rail. Wherein, when the second rail is moved from a first predetermined position along a first direction and a rail section of the second rail exceeds the end portion the first rail and is located at the outside of the passage of the first rail, the second function portion of the first function member is configured to support at least one part of the rail section of the second rail. Wherein, the first function portion of the first function member is configured to prevent the sliding auxiliary device from being moved from the passage of the first rail to the outside of the passage of the first rail.

Preferably, the second rail comprises at least one pushing portion, when the second rail is moved from the first predetermined position along the first direction to a second predetermined position, the sliding auxiliary device sliding auxiliary device is pushed by the at least one pushing portion of the second rail and moved from a first sliding auxiliary position to a second sliding auxiliary position and the first function portion of the first function member is able to block the sliding auxiliary device to stop at the second sliding auxiliary position, in order to prevent the sliding auxiliary device from being moved from the passage of the first rail to the outside of the passage of the first rail.

Preferably, the first function portion and the second function portion of the first function member are integrated on one component.

Preferably, the second rail comprises a third wall, a fourth wall and a second longitudinal wall connected between the third wall and the fourth wall, the slide rail assembly further comprises a second function member, the second function member is arranged on the first rail adjacent to the end portion of the first rail and the second wall, when the second rail is moved from the first predetermined position along the first direction and the rail section of the second rail exceeds the end portion of the first rail and is located at the outside of the passage of the first rail, the second function portion of the first function member and the second function portion of the second function member are configured to respectively support at least one part of the third wall and the fourth wall of the rail section of the second rail.

Preferably, the first function member includes a first function member and a second function member, when the second rail is moved from the first predetermined position along the first direction and the rail section of the second rail exceeds the end portion of the first rail and is located at the outside of the passage of the first rail, the second function portion of the first function member and the second function portion of the second function member are configured to respectively support at least one part of the third wall and the fourth wall of the rail section of the second rail.

Preferably, the plurality of rolling members of the sliding auxiliary device includes at least one lower rolling ball and at least one upper rolling ball. The at least one lower rolling ball is configured to support between the first wall of the first rail and the third wall of the second rail. The at least one upper rolling ball is configured to support between the second wall of the first rail and the fourth wall of the second rail.

Preferably, a cross-section of the first function member includes a first supporting section and a second supporting section, and a cross-section of the second function member includes a first supporting section and a second supporting section. The first supporting section and the second supporting section of the first function member are respectively configured to correspond to a ball groove of the first wall of the first rail and a ball groove of the third wall of the second rail. The first supporting section and the second supporting section of the second function member are respectively configured to correspond to a ball groove of the second wall of the first rail and a ball groove of the fourth wall of the second rail.

Preferably, the slide rail assembly further includes a bracket device. Wherein, the bracket device is connected to the first rail and adjacent to the end portion of the first rail. The bracket device includes a first supporting wall, a second supporting wall and a side wall connected between the first supporting wall and the second supporting wall. The first supporting wall is configured to support the first wall of the first rail and the second function portion of the first function member, the second supporting wall is configured to support the second wall of the first rail and the second function portion of the second function member.

Preferably, the first supporting wall of the bracket device has a first feature, the second function portion of the first function member has a second feature, the first feature and the second feature correspond to each other.

Preferably, the second supporting wall of the bracket device has a third feature. The second function portion of the second function member has a fourth feature, the third feature and the fourth feature correspond to each other.

Preferably, the bracket device further includes at least one mounting member. The at least one mounting member is configured to mount the first rail to a rack.

Preferably, the slide rail assembly further includes a third rail movably mounted in a passage of the second rail.

According to another aspect of the present invention, a slide rail assembly includes a first rail, a second rail, a sliding auxiliary device and a first function member. Wherein, a passage is defined by the first rail. The second rail is movably mounted in the passage of the first rail. The sliding auxiliary device is arranged in the passage of the first rail. The first function member is arranged on the first rail and adjacent to an end portion of the first rail. Wherein, the first function member includes a first function portion and a second function portion connected to the first function portion. The first function portion is located in the passage of the first rail. The second function portion exceeds the end portion of the first rail and is located at outside of the passage of the first rail. Wherein, when the second rail is moved from a first predetermined position along a first direction and a rail section of the second rail exceeds the end portion the first rail and is located at the outside of the passage of the first rail, the second function portion of the first function member is configured to support at least one part of the rail section of the second rail.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
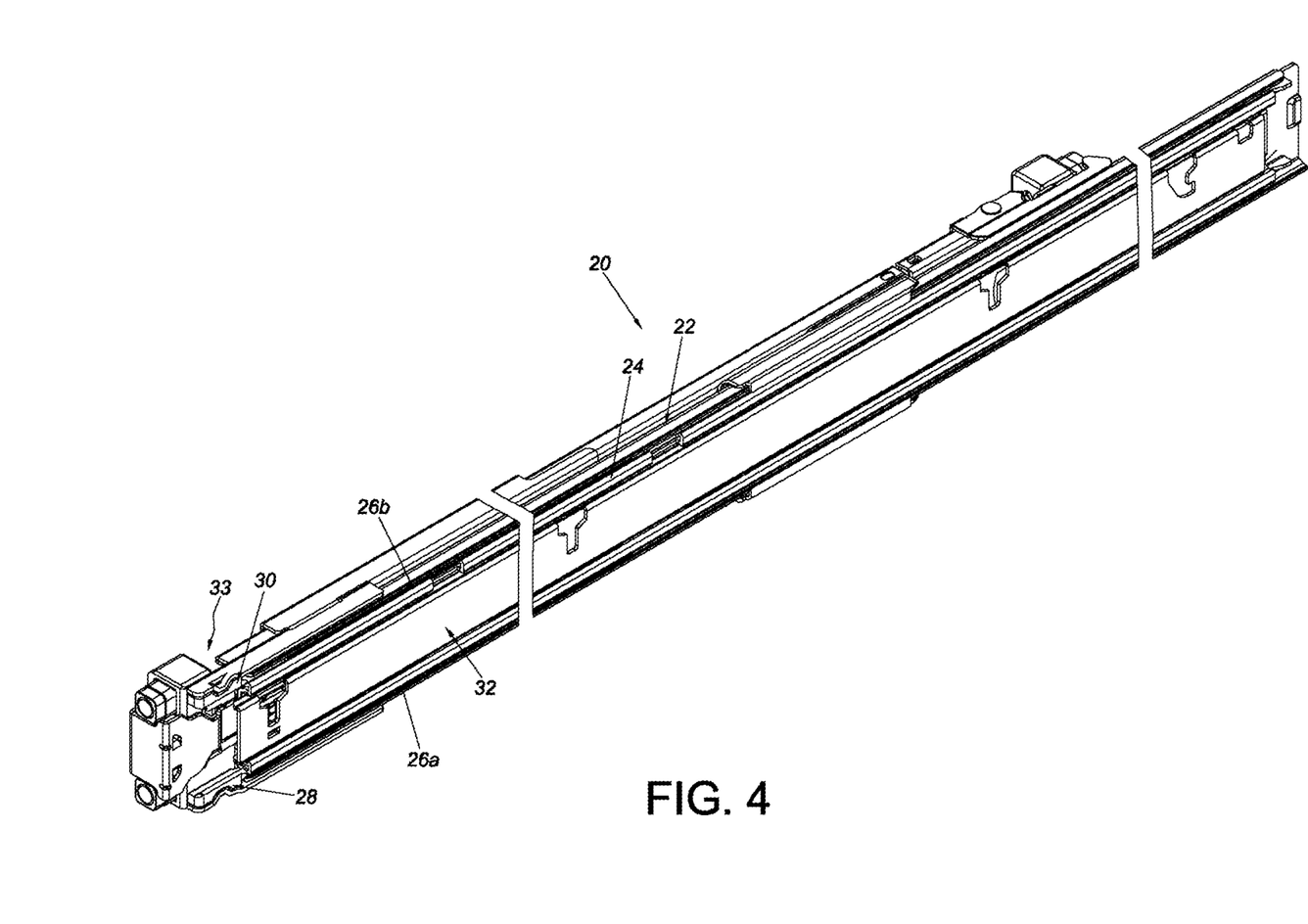
FIG. 4 is a diagram illustrating a slide rail assembly according to an embodiment of the present invention.
Figure 5:
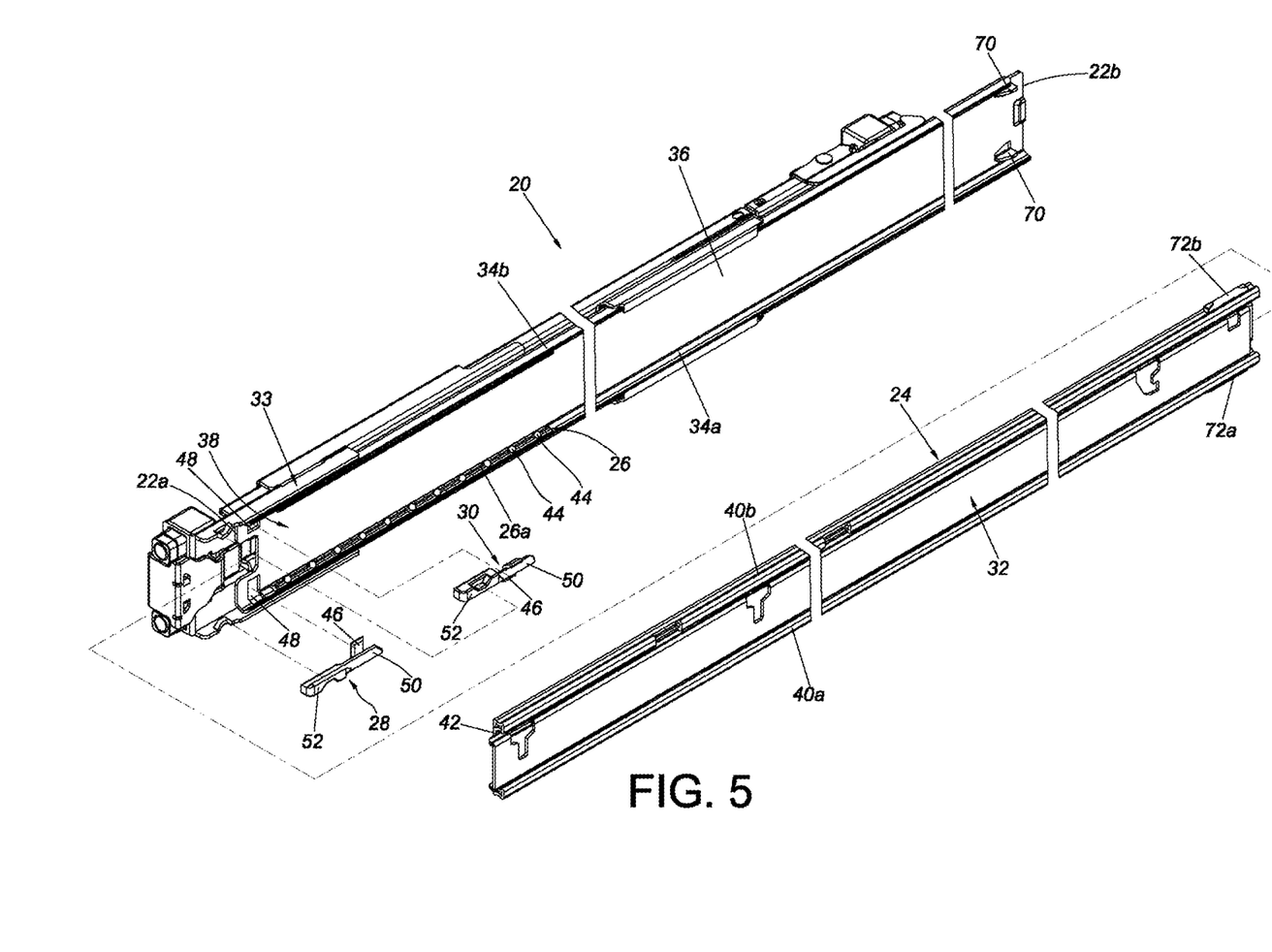
FIG. 5 is an exploded view illustrating the slide rail assembly according to the embodiment of the present invention.

As shown in FIG. 4 and FIG. 5, a slide rail assembly 20 of an embodiment of the present invention includes a first rail 22, a second rail 24, a sliding auxiliary device 26 and at least one function member (such as a first function member 28 and a second function member 30). Preferably, the slide rail assembly 20 further includes a third rail 32 and a bracket device 33.

The first rail 22 has a first end portion 22a and a second end portion 22b (such as a front end portion and a rear end portion, but the present invention is not limited). The first rail 22 includes a first wall 34a, a second wall 34b and a first longitudinal wall 36 connected between the first wall 34a and the second wall 34b. A passage 38 is defined by the first wall 34a, the second wall 34b and the first longitudinal wall 36.

The second rail 24 is movably mounted in the passage 38 of the first rail 22. The second rail 24 includes a third wall 40a, a fourth wall 40b and a second longitudinal wall 42 connected between the third wall 40a and the fourth wall 40b. A passage is defined by the third wall 40a, the fourth wall 40b and the second longitudinal wall 42. The third rail 32 is movably mounted in the passage of the second rail 24.

The sliding auxiliary device 26 is arranged in the passage 38 of the first rail 22. The sliding auxiliary device 26 includes a plurality of rolling members 44 configured to improve the smoothness of the movement between the second rail 24 and the first rail 22. For example, the sliding auxiliary device 26 includes a first sliding auxiliary portion 26a and a second sliding auxiliary portion 26b. The first sliding auxiliary portion 26a and the second sliding auxiliary portion 26b respectively include a plurality of lower rolling balls 44 and a plurality of upper rolling balls 44 (please refer to FIG. 7 and FIG. 8).

Figure 6:
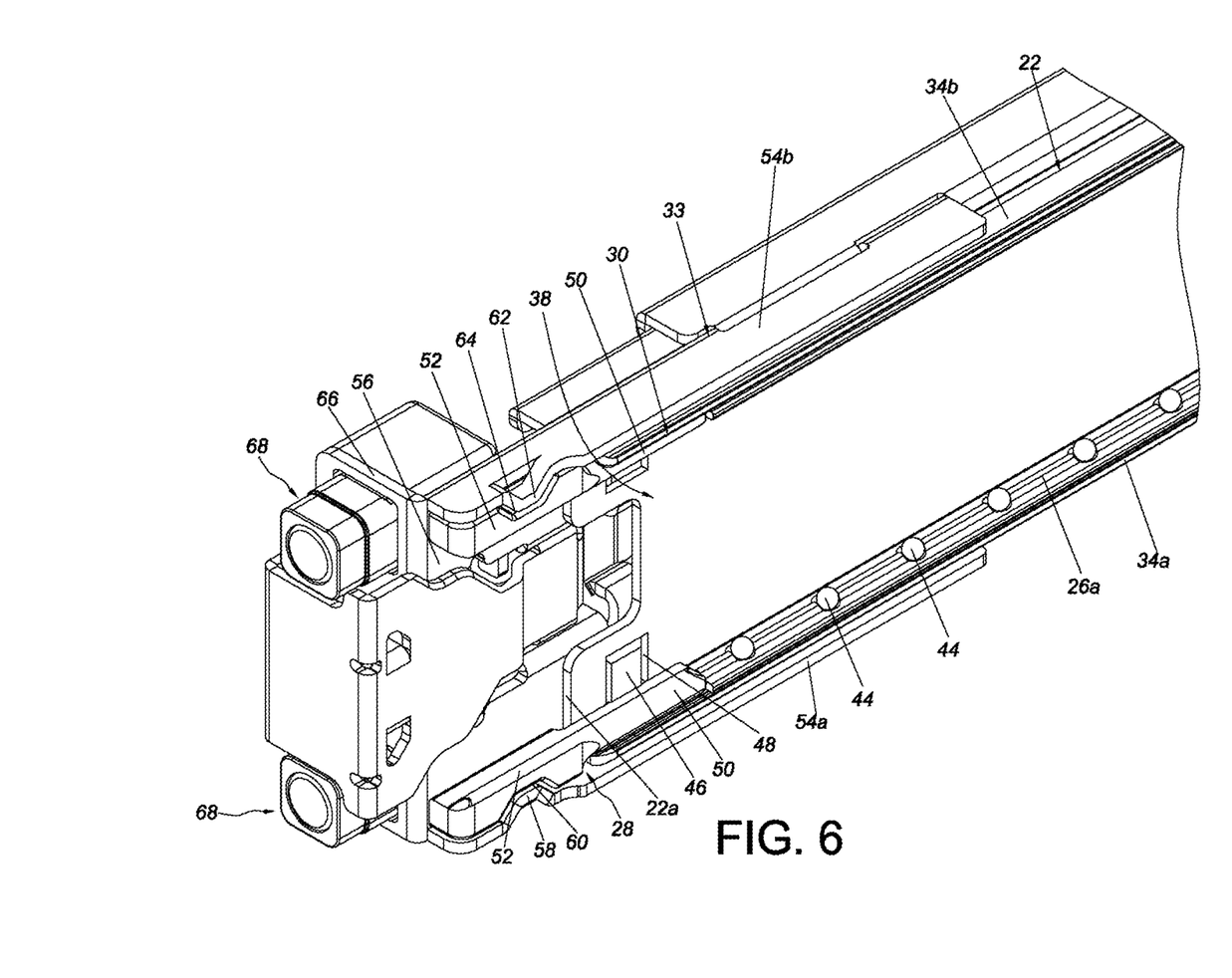
FIG. 6 is a diagram illustrating the slide rail assembly according including a first rail, a bracket device and at least one function member according to the embodiment of the present invention.

As shown in FIG. 5 and FIG. 6, the first function member 28 and the second function member 30 are fixedly arranged on the first rail 22 and located adjacent to an end portion of the first rail 22 (e.g. the first end portion 22a). Preferably, the first function member 28 and the second function member 30 both include metal material. The first function member 28 is arranged adjacent to the first wall 34a of the first rail 22, and the second function member 30 is arranged adjacent to the second wall 34b of the first rail 22. The first function member 28 and the second function member 30 are connected to the first rail 22 by substantially a same connecting method. The first function member 28 and the second function member 30 have substantially a same structural configuration.

Take the first function member 28 for example, the first function member 28 and the first rail 22 respectively have a first connecting portion 46 and a second connecting portion 48 corresponding to the first connecting portion 46. The first connecting portion 46 and the second connecting portion 48 are configured to be connected to each other. In the present embodiment, the first connecting portion 46 and the second connecting portion 48 are connected by engaging or fastening. In some embodiment, the first connecting portion 46 and the second connecting portion 48 may be connected by riveting or welding, but the present invention is not limited thereto. Furthermore, the first function member 28 includes a first function portion 50 and a second function portion 52. Hereinafter, it is illustrative of an example that the first function portion 50 and the second function portion 52 are connected by integrated together.

The first connecting portion 46 is arranged on the first function portion 50, but the present invention is not limited thereto specifically. The first function portion 50 is located in the passage 38 of the first rail 22. The second function portion 52 exceeds the first end portion 22a of the first rail 22 and located at outside of the passage 38 of the first rail 22.

The bracket device 33 is connected to the first rail 22 and located adjacent to the first end portion 22a of the first rail 22. The bracket device 33 includes a first supporting wall 54a, a second supporting wall 54b and a side wall 56 connected between the first supporting wall 54a and the second supporting wall 54b. The first supporting wall 54a is configured to support the first wall 34a of the first rail 22 and the second function portion 52 of the first function member 28. The second supporting wall 54b is configured to support the second wall 34b of the first rail 22 and the second function portion 52 of the second function member 30.

Preferably, the first supporting wall 54a of the bracket device 33 and the second function portion 52 of the first function member 28 respectively have a first feature 58 and a second feature 60 corresponding to the first feature 58. The second supporting wall 54b of the bracket device 33 and the second function portion 52 of the second function member 30 respectively have a third feature 62 and a fourth feature 64 corresponding to the third feature 62. In the present embodiment, the structure of the first feature 58 and the second feature 60 is a combination of concave and convex structures engaged with each other, such that the first supporting wall 54a and the second function portion 52 of the first function member 28 are able to be supported by or engaged with each other. Similarly, the structure of the third feature 62 and the fourth feature 64 is also a combination of concave and convex structures engaged with each other, such that the second supporting wall 54b and the second function portion 52 of the second function member 30 are able to be supported by or engaged with each other.

Preferably, the bracket device 33 further includes an end wall 66 substantially bent perpendicularly relative to the side wall 56. At least one mounting member 68 is arranged on the end wall 66. The at least one mounting member 68 is configured to mount the first rail 22 on a rack.

Figure 7:
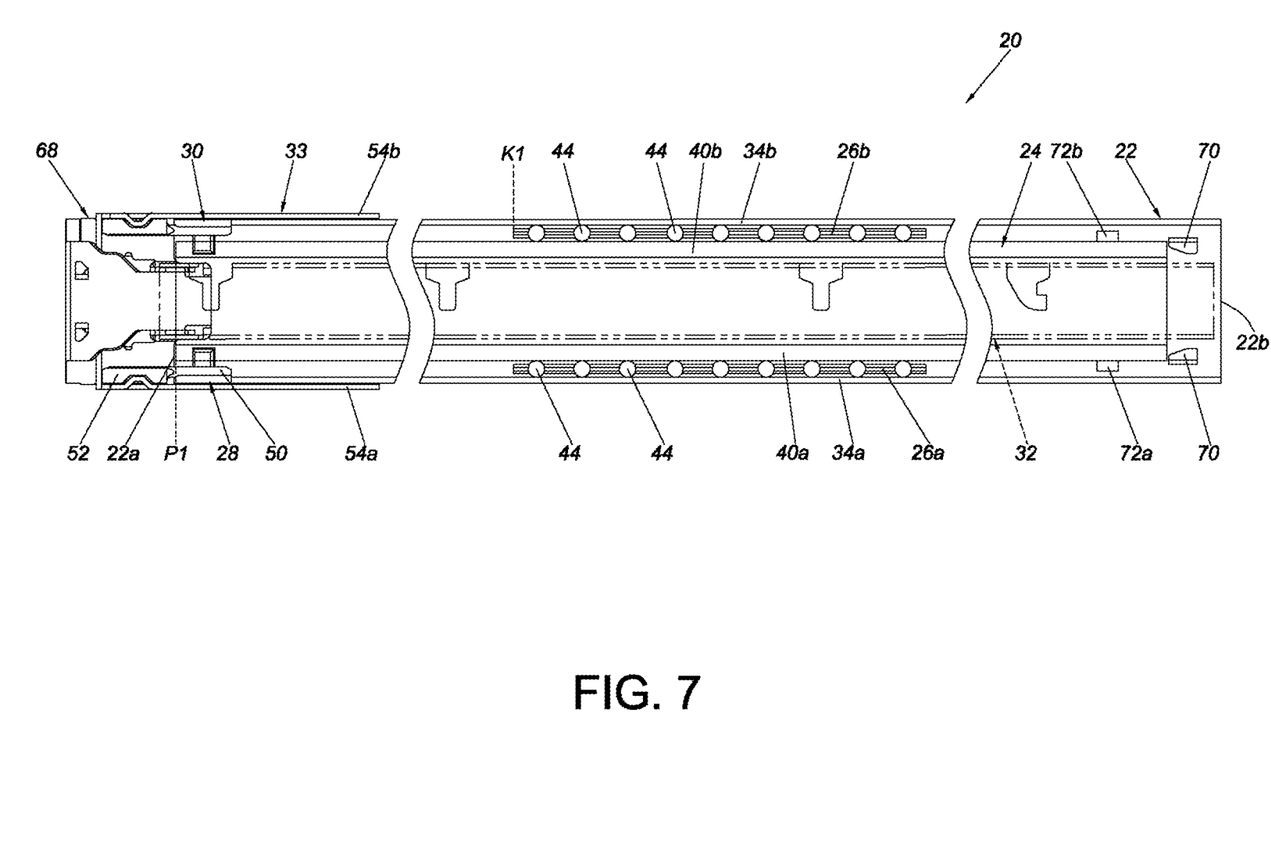
FIG. 7 is a diagram illustrating the slide rail assembly being in a retracted state according to the embodiment of the present invention.

As shown in FIG. 7, the slide rail assembly 20 is in a retracted state. Wherein, the second rail 24 is located at a first predetermined position P1 (such as a retracted position, but not limited thereto) relative to the first rail 22, and the third rail 32 is retracted relative to the second rail 24, and the sliding auxiliary device 26 (such as the first sliding auxiliary portion 26a and the second sliding auxiliary portion 26b) is located at a first sliding auxiliary position K1. In addition, the plurality of lower rolling balls 44 of the first sliding auxiliary portion 26a of the sliding auxiliary device 26 is configured to support between the first wall 34a of the first rail 22 and the third wall 40a of the second rail 24. The plurality of upper rolling balls 44 of the second sliding auxiliary portion 26b of the sliding auxiliary device 26 is configured to support between the second wall 34b of the first rail 22 and the fourth wall 40b of the second rail 24.

Preferably, the first rail 22 further includes at least one blocking portion 70 adjacent to the second end portion 22b of the first rail 22. The at least one blocking portion 70 is configured to prevent the second rail 24 from being moved along a second direction (e.g. a retracing direction) and detached from the first rail 22.

Preferably, the second rail 24 further includes at least one pushing portion. For example, the second rail 24 includes a first pushing portion 72a and a second pushing portion 72b corresponding to the first sliding auxiliary portion 26a of the sliding auxiliary device 26 and the second sliding auxiliary portion 26b.

Figure 8:
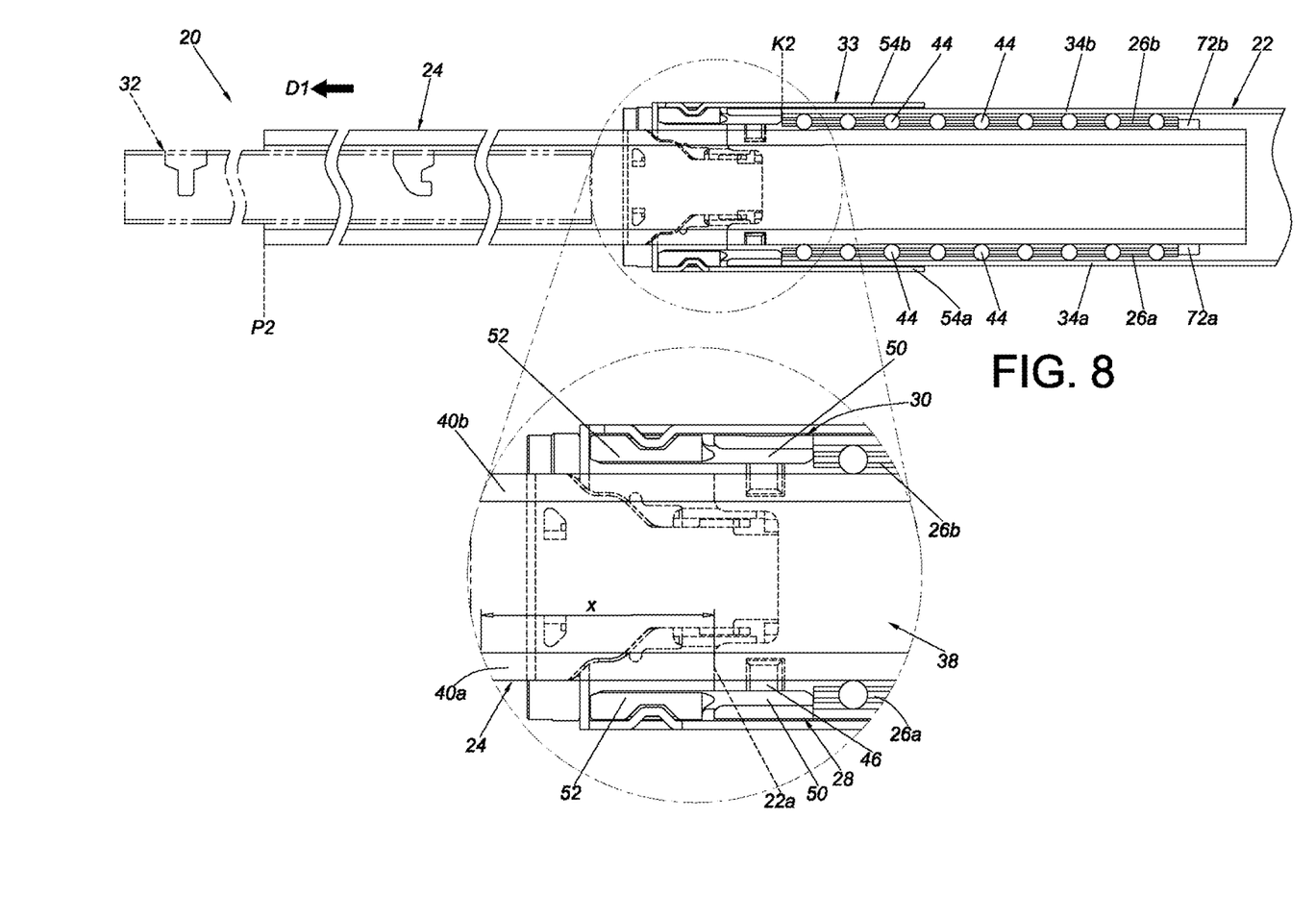
FIG. 8 is a diagram illustrating the slide rail assembly being in an extended state according to the embodiment of the present invention.

As shown in FIG. 7 and FIG. 8, when the second rail 24 is moved from the first predetermined position P1 along a first direction D1 (such as a extending direction) and a rail section X of the second rail 24 exceeds the first end portion 22a of the first rail 22 and is located at outside of the passage 38 of the first rail 22, the second function portion 52 of the at least one function member (such as the first function member 28) is able to be configured to support at least one part of the rail section X of the second rail 24. In addition, the first function portion 50 of the at least one function member (such as the first function member 28) is configured to prevent the sliding auxiliary device 26 from being moved from inside of the passage 38 of the first rail 22 to the outside of the passage 38 of the first rail 22. Specifically, when the second rail 24 is moved from the first predetermined position P1 along the first direction D1 to a second predetermined position P2 (such as an extended position, but not limited thereto), the sliding auxiliary device 26 is pushed by the at least one pushing portion (i.e., the first pushing portion 72a and the second pushing portion 72b) to be moved from the first sliding auxiliary position K1 along the first direction D1 to a second sliding auxiliary position K2 (as shown in FIG. 8) and the first function portion 50 of the at least one function member (such as the first function member 28 and the second function member 30) is able to block the sliding auxiliary device 26 (for example, to block the first sliding auxiliary portion 26a and the second sliding auxiliary portion 26b) to stop at the second sliding auxiliary position K2, in order to prevent the sliding auxiliary device 26 from being moved from the inside the passage 38 of the first rail 22 to the outside of the passage 38 of the first rail 22.

Preferably, when the second rail 24 is moved from the first predetermined position P1 along the first direction D1 to the second predetermined position P2 and the slide rail assembly 20 is in an extending state and the rail section X of the second rail 24 exceeds the first end portion 22a of the first rail 22 and be located at the outside of the passage 38 of the first rail 22, the second function portion 52 of the first function member 28 and the second function portion 52 of the second function member 30 are respectively configured to support the third wall 40a of the rail section X of the second rail 24 and at least one part of the fourth wall 40b (as shown in FIG. 8).

Preferably, when the second rail 24 is moved from the first predetermined position P1 along the first direction D1 to the second predetermined position P2, two ends (such as a front end and a rear end) of the first sliding auxiliary portion 26a respectively abut against the first function portion 50 of the first function member 28 and the first pushing portion 72a of the second rail 24, two ends (such as a front end and a rear end) of the second sliding auxiliary portion 26b respectively abut against the first function portion 50 of the second function member 30 and the second pushing portion 72b of the second rail 24 (as shown in FIG. 8).

Figure 9:
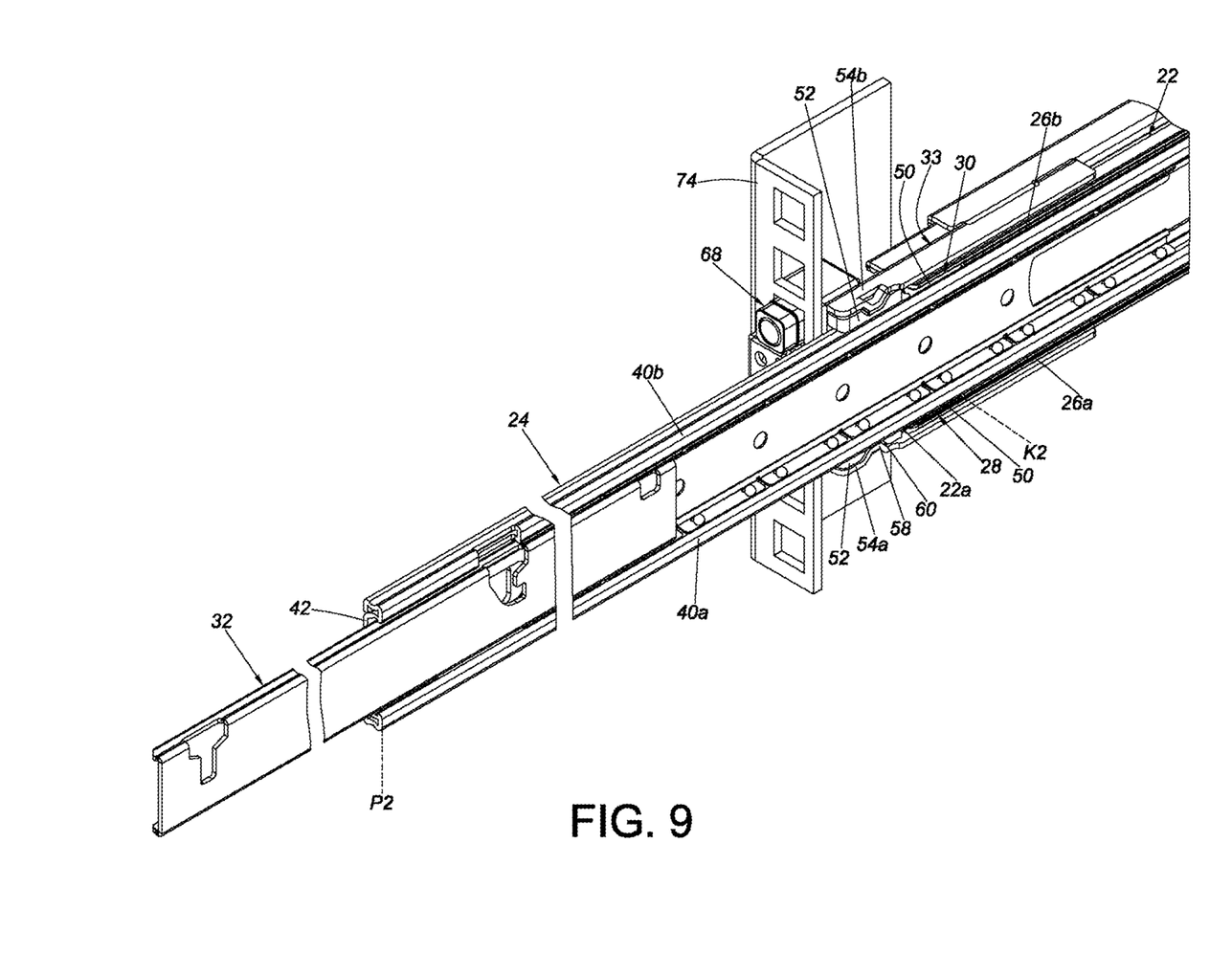
FIG. 9 is a diagram illustrating the slide rail assembly being mounted on a rack in the extended state according to the embodiment of the present invention.

As shown in FIG. 9, the at least one mounting member 68 of the bracket device 33 is configured to mount the first rail 22 to a post 74 of a rack. Wherein, the slide rail assembly 20 is in the extending state. The structure configuration of the slide rail assembly 20 in the extending state is shown in FIG. 8. For simplification, no further illustration is provided.

Figure 10:
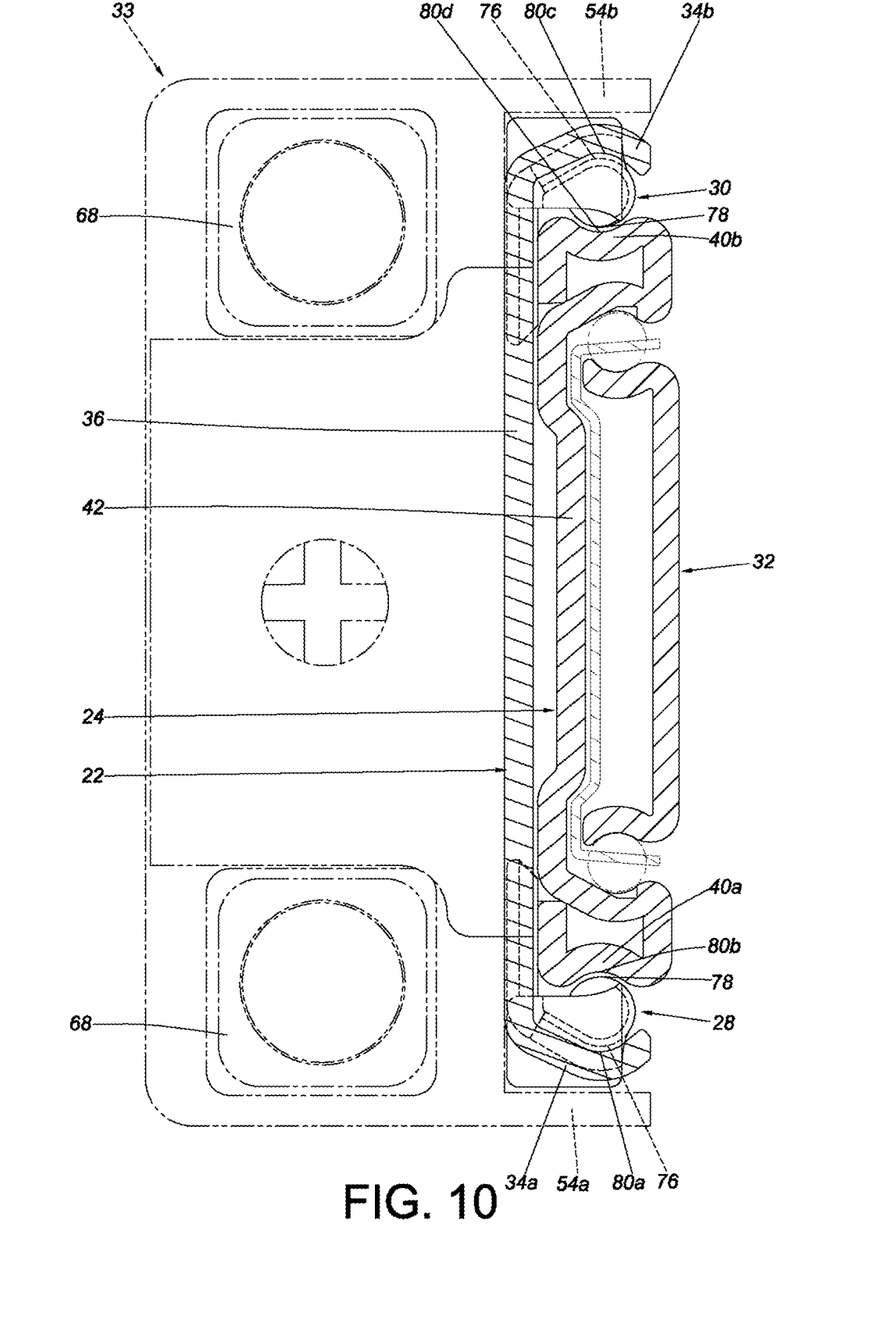
FIG. 10 is a cross-section view illustrating the slide rail assembly according to the embodiment of the present invention.

As shown in FIG. 10, a cross-section of the first function member 28 and a cross-section of the second function member 30 both include a first supporting section 76 and a second supporting section 78. The first supporting section 76 and the second supporting section 78 of the first function member 28 are respectively configured to correspond to a first ball groove 80a of the first wall 34a of the first rail 22 and a second ball groove 80b of the third wall 40a of the second rail 24 (for example, the supporting section and the ball groove support each other). The first supporting section 76 and the second supporting section 78 of the second function member 30 are respectively configured to correspond to a third ball groove 80c of the second wall 34b of the first rail 22 and a fourth ball groove 80d of the fourth wall 40b of the second rail 24 (for example, the supporting section and the ball groove support each other).

Compared to the prior art, the slide rail assembly 20 of the present embodiment has advantages over the prior art by the following perspectives:

1. Comparing to a gap 124 being formed between the supporting member 120 and the first blocking base 110 in the prior art (please refer to FIG. 1 or FIG. 3), the first function portion 50 of the at least one function member of the embodiment of the present invention (such as the first function member 28 or the second function member 30) is located in the passage 38 of the first rail 22. The second function portion 52 is extended from the first function portion 50 and exceeds the end portion 22a of the first rail 22 and be located at the outside of the passage 38 of the first rail 22. Therefore, the at least one function member (such as the first function member 28 or the second function member 30) has improved structural strength. Wherein, when the second rail 24 is located on the second predetermined position P2, the second function portion 52 of the at least one function member is able to be configured to support at least one part of the rail section X of the second rail 24, the first function portion 50 of the at least one function member is able to be configured to block and to prevent the sliding auxiliary device 26 from being moved from the inside of the passage 38 of the first rail 22 to the outside of the passage 38 of the first rail 22.

2. The first supporting wall 54a of the bracket device 33 is configured to support the first wall 34a of the first rail 22 and the second function portion 52 of the first function member 28. The second supporting wall 54b of the bracket device 33 is configured to support the second wall 34b of the first rail 22 and the second function portion 52 of the second function member 30. As such, the bracket device 33, the first rail 22 and the at least one function member (such as the first function member 28 and the second function member 30) are able to support each other and improve strength of structure.

3. Extra materials can be reduced and the cost of inventory management can also be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail comprising a first wall, a second wall and a first longitudinal wall connected between the first wall and the second wall, a passage being defined by the first wall, the second wall and the first longitudinal wall;
a second rail movably mounted in the passage of the first rail;
a sliding auxiliary device arranged in the passage of the first rail, the sliding auxiliary device comprising a plurality of rolling members configured to support between the first rail and the second rail; and
a first function member arranged on the first rail and adjacent to an end portion of the first rail and the first wall, wherein the first function member comprises a first function portion and a second function portion, the first function portion is located in the passage of the first rail, the second function portion exceeds the end portion of the first rail and located at outside of the passage of the first rail;
wherein when the second rail is moved from a first predetermined position along a first direction and a rail section of the second rail exceeds the end portion the first rail and is located at the outside of the passage of the first rail, the second function portion of the first function member is configured to support a part of the rail section of the second rail;
wherein the first function portion of the first function member is configured to prevent the sliding auxiliary device from being moved from the passage of the first rail to the outside of the passage of the first rail.

2. The slide rail assembly of claim 1, wherein the second rail comprises at least one pushing portion, when the second rail is moved from the first predetermined position along the first direction to a second predetermined position, the sliding auxiliary device is pushed by the at least one pushing portion of the second rail and moved from a first sliding auxiliary position to a second sliding auxiliary position and the first function portion of the at least one function member is able to block the sliding auxiliary device to stop at the second sliding auxiliary position, in order to prevent the sliding auxiliary device from being moved from the passage of the first rail to the outside of the passage of the first rail.

3. The slide rail assembly of claim 1, wherein the first function portion and the second function portion of the first function member are integrated on one component.

4. The slide rail assembly of claim 1, wherein the second rail comprises a third wall, a fourth wall and a second longitudinal wall connected between the third wall and the fourth wall, the slide rail assembly further comprises a second function member comprising and first function portion and a second function portion, the second function member is arranged on the first rail adjacent to the end portion of the first rail and the second wall, when the second rail is moved from the first predetermined position along the first direction and the rail section of the second rail exceeds the end portion of the first rail and is located at the outside of the passage of the first rail, the second function portion of the first function member and the second function portion of the second function member are configured to respectively support at least one part of the third wall and the fourth wall of the rail section of the second rail.

5. The slide rail assembly of claim 4, wherein the plurality of rolling members of the sliding auxiliary device comprises at least one lower rolling ball and at least one upper rolling ball, the at least one lower rolling ball is configured to support between the first wall of the first rail and the third wall of the second rail, the at least one upper rolling ball is configured to support between the second wall of the first rail and the fourth wall of the second rail.

6. The slide rail assembly of claim 5, wherein a cross-section of the first function member comprises a first supporting section and a second supporting section, and a cross-section of the second function member comprises a first supporting section and a second supporting section, the first supporting section and the second supporting section of the first function member are respectively configured to correspond to a ball groove of the first wall of the first rail and a ball groove of the third wall of the second rail, the first supporting section and the second supporting section of the second function member are respectively configured to correspond to a ball groove of the second wall of the first rail and a ball groove of the fourth wall of the second rail.

7. The slide rail assembly of claim 4, further comprising a bracket device, wherein the bracket device is connected to the first rail and adjacent to the end portion of the first rail, the bracket device comprises a first supporting wall, a second supporting wall and a side wall connected between the first supporting wall and the second supporting wall, the first supporting wall is configured to support the first wall of the first rail and the second function portion of the first function member, the second supporting wall is configured to support the second wall of the first rail and the second function portion of the second function member.

8. The slide rail assembly of claim 7, wherein the first supporting wall of the bracket device has a first feature, the second function portion of the first function member has a second feature, the first feature and the second feature correspond to each other.

9. The slide rail assembly of claim 8, wherein the second supporting wall of the bracket device has a third feature, the second function portion of the second function member has a fourth feature, the third feature and the fourth feature correspond to each other.

10. The slide rail assembly of claim 7, wherein the bracket device further comprises at least one mounting member, the at least one mounting member is configured to mount the first rail to a rack.

11. The slide rail assembly of claim 1, further comprising a third rail movably mounted in a passage of the second rail.

12. A slide rail assembly, comprising:
a first rail, wherein a passage is defined by the first rail;
a second rail movably mounted in the passage of the first rail;
a sliding auxiliary device arranged in the passage of the first rail; and
a first function member arranged on the first rail and adjacent to an end portion of the first rail, wherein the first function member comprises a first function portion and a second function portion connected to the first function portion, the first function portion is located in the passage of the first rail,
the second function portion exceeds the end portion of the first rail and is located at outside of the passage of the first rail;
wherein when the second rail is moved from a first predetermined position along a first direction and a rail section of the second rail exceeds the end portion the first rail and is located at the outside of the passage of the first rail, the second function portion of the first function member is configured to support a part of the rail section of the second rail.

13. The slide rail assembly of claim 12, wherein the first rail comprises a first wall, a second wall and a first longitudinal wall connected between the first wall and the second wall, the passage is defined by the first wall, the second wall and the first longitudinal wall, the first function member is arranged on the first rail adjacent to the first wall.

14. The slide rail assembly of claim 13, wherein the second rail comprises a third wall, a fourth wall and a second longitudinal wall connected between the third wall and the fourth wall, the slide rail assembly further comprises a second function member, the second function member is arranged on the first rail adjacent to the end portion of the first rail and the second wall, when the second rail is moved from the first predetermined position along the first direction and the rail section of the second rail exceeds the end portion of the first rail and is located at the outside of the passage of the first rail, the second function portion of the first function member and the second function portion of the second function member are configured to respectively support at least one part of the third wall and the fourth wall of the rail section of the second rail.

15. The slide rail assembly of claim 14, further comprising a bracket device, wherein the bracket device is connected to the first rail and adjacent to the end portion of the first rail, the bracket device comprises a first supporting wall, a second supporting wall and a side wall connected between the first supporting wall and the second supporting wall, the first supporting wall is configured to support the first wall of the first rail and the second function portion of the first function member, the second supporting wall is configured to support the second wall of the first rail and the second function portion of the second function member.

16. The slide rail assembly of claim 15, wherein the first supporting wall of the bracket device has a first feature, the second function portion of the first function member has a second feature, the first feature and the second feature correspond to each other, the second supporting wall of the bracket device has a third feature, the second function portion of the second function member has a fourth feature, the third feature and the fourth feature correspond to each other.

17. The slide rail assembly of claim 12, wherein material of the first function member is metal material.

18. The slide rail assembly of claim 12, wherein the bracket device further comprises at least one mounting member, the at least one mounting member is configured to mount the first rail to a rack.

\* \* \* \* \*